(12) United States Patent
Bu et al.

(10) Patent No.: US 7,863,123 B2
(45) Date of Patent: Jan. 4, 2011

(54) DIRECT CONTACT BETWEEN HIGH-κ/METAL GATE AND WIRING PROCESS FLOW

(75) Inventors: Huiming Bu, Millwood, NY (US); Michael P. Chudzik, Danbury, CT (US); Ricardo A. Donaton, Cortlandt Manor, NY (US); Naim Moumen, Walden, NY (US); Hongwen Yan, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/355,953

(22) Filed: Jan. 19, 2009

(65) Prior Publication Data

US 2010/0181630 A1 Jul. 22, 2010

(51) Int. Cl.
*H01L 21/336* (2006.01)
(52) U.S. Cl. ............... 438/197; 438/201; 438/231; 438/239; 438/285; 438/299; 257/E21.438
(58) Field of Classification Search ............ 438/203
See application file for complete search history.

(56) References Cited

U.S. PATENT DOCUMENTS 6,475,906 B1 11/2002 Lee
7,081,393 B2 7/2006 Belyansky et al.
7,405,497 B2 7/2008 Jacobs et al.
7,435,652 B1 10/2008 Chen et al.
2004/0183204 A1* 9/2004 Cave et al. ............ 257/774
2005/0186792 A1 8/2005 Takahashi
2006/0192258 A1 8/2006 Tsuchiya et al.
2007/0257302 A1 11/2007 Kang et al.
2008/0164498 A1* 7/2008 Taylor ................ 257/288
2008/0311711 A1* 12/2008 Hampp et al. ........... 438/197

OTHER PUBLICATIONS

International Application No. PCT/EP2010/050295 Filing Date: Dec. 1, 2010 International Searching Authority—ISR and Written Opinion.

* cited by examiner

*Primary Examiner*—N Drew Richards
*Assistant Examiner*—Kyoung Lee
(74) *Attorney, Agent, or Firm*—Whitman, Curtis, Christofferson & Cook, P.C.; Joseph P. Abate

(57) ABSTRACT

A low resistance contact is formed to a metal gate or a transistor including a High-κ gate dielectric in a high integration density integrated circuit by applying a liner over a gate stack, applying a fill material between the gate stacks, planarizing the fill material to support high-resolution lithography, etching the fill material and the liner selectively to each other to form vias and filling the vias with a metal, metal alloy or conductive metal compound such as titanium nitride.

20 Claims, 2 Drawing Sheets

DIRECT CONTACT BETWEEN HIGH-κ/METAL GATE AND WIRING PROCESS FLOW

BACKGROUND OF THE INVENTION

1. Field of the Invention

The present invention generally relates to semiconductor devices and integrated circuits including metal-oxide-semiconductor field effect transistors (MOSFETs) and, more particularly, to high performance MOSFETs utilizing high-κ gate insulators and metal gates and the formation of low resistance connections thereto.

2. Description of the Prior Art

The desire for increased functionality and increased operating speed of integrated circuits and other electronic devices formed on a semiconductor chip has driven integration density to extreme levels while leading to the development of increasingly sophisticated transistor designs and features in order to preserve and enhance performance as transistors are scaled to smaller sizes. One such design feature is the use of high-κ gate insulators in MOSFETs in order to improve control of the electric field in the transistor channel. However, it has been found that conventional polysilicon gates do not work well with high-κ dielectrics because of transistor threshold voltage pinning Previous publications have claimed this phenomenon is caused by Fermi level pinning effect at the interface between polysilicon and high-κ dielectric. In addition, polyslicon height scaling has been a key technology element to provide parasitic capacitance reduction and gives process space for large angle implantation (such as halo implantation as required for short channel control) as technology node shrinks The doping of scaled polysilicon as a requirement for gate resistance reduction has become very challenging because of the concern about dopant penetration into the transistor channel area. Hence, for the gate electrode, it is generally considered to use a metal, metal alloy or conductive compound of metal such as titanium nitride, hereinafter collectively referred to as simply "metal gate", rather than polysilicon. The transistor threshold voltage is usually determined or modulated by metal gate work function. The use of a metal gate can provide low gate resistance, enhances the uniformity of the electric field produced in the transistor channel for which the very thin high-κ gate dielectric is also employed. While the metal gate can also be very thin, it is a preferred practice to provide sidewalls on the gate stack to control the location of impurity implantation relative to the gate stack position. Since such sidewalls are typically formed by an isotropic deposition followed by an anisotropic etch, it is generally necessary to provide substantial height for the gate stack to achieve the desired sidewall thickness at the sides to the gate dielectric. It may also be desirable to provide additional structures in the gate stack such as stressed layers to enhance carrier mobility and the like. However, any thickness of the gate electrode approaching the needed gate stack height may alter the transistor threshold voltage and is likely to complicate the etching process for patterning the gate stack. Further, to support accurate formation of very fine and closely spaced conductors, it is generally necessary to develop a highly planar surface by depositing materials which must at least fill, and preferably overfill, the spaces between transistor gate and other structures which also favors design and fabrication of relatively tall gate stacks. As a result, the resistance within the gate stack is generally far higher than may be desired if conventional polysilicon materials or the like are employed to make up the required gate stack height.

SUMMARY OF THE INVENTION

It is therefore an object of the present invention to provide a highly conductive structure for direct contact with metal or silicided transistor electrodes.

In order to accomplish these and other objects of the invention, a method of forming a transistor having a high-κ gate dielectric and a metal, metal alloy or conductive metal compound gate, is provided comprising the steps of:

(a) forming a gate stack including a high-κ dielectric layer and a metal, metal alloy or conductive metal compound gate layer on a substrate;

(b) forming silicided regions corresponding to at least one of a source and a drain of said transistor;

(c) forming a liner layer over the gate stack and at least one of a source and a drain of said transistor;

(d) forming a layer of fill material having a height equal to or greater than the gate stack;

(e) selectively etching the fill material to the liner layer;

(f) selectively etching the liner layer and the gate stack to the metal gate and at least one of a source and drain region; and (g) filling openings formed by the selectively etching steps with metal, metal alloy and/or one or more conductive metal compounds.

Preferably, the step of filling the openings includes additional steps of forming a liner in the openings of a first conductive material including a metal, and filling a remainder of the openings inside the liner with a metal. Preferably, the step of forming a gate stack includes a step of forming a gate body. They gate body may be formed of an insulator. The insulator may be composed of silicon nitride. Preferably, the linear layer formed is silicon nitride. The step of forming a layer of fill material preferably includes an etching or planarizing step. Preferably, the etching or planarizing step forms a thickness of fill material above the gate stack which is approximately complementary to a thickness of fill material adjacent the gate stack.

Further, the step of forming a gate stack preferably includes a step of forming a gate body. Preferably, the gate body is formed of an insulator, where the insulator is silicon nitride. Preferably, the liner layer is silicon nitride. Preferably, the step of forming a layer of fill material includes an etching or planarizing step. Preferably, the etching or planarizing step forms a thickness of fill material above the gate stack which is approximately complementary to a thickness of fill material adjacent the gate stack.

In another embodiment of the present invention, a method of forming a low resistance contact in an integrated circuit is provided, comprising steps of (a) forming a liner layer over a structure to which the low resistance electrical contact is to be made;

(b) forming a layer of fill material having a height equal to the structure;

(c) selectively etching said fill material to the liner layer;

(d) selectively etching said liner layer and the gate stack to the metal gate and at least one of a source and drain region; and (e) filling openings formed by the selectively etching steps with metal.

Preferably, the step of filling the openings includes further steps of forming a liner in the openings of a first conductive material including a metal, and filling a remainder of the openings inside the liner with a metal.

In yet another embodiment of the present invention, an integrated circuit including at least one transistor is provided, comprising a gate stack that includes a high-κ gate dielectric, a metal gate electrode overlying the gate dielectric, a liner layer extending over the transistor, a fill material layer providing a substantially planar surface above the liner, and a metal connection extending through the liner layer and the fill material layer to the metal gate electrode.

Preferably, the gate stack further includes a gate body which is, preferably, comprised of an insulating material. Preferably, the insulating material is silicon nitride.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
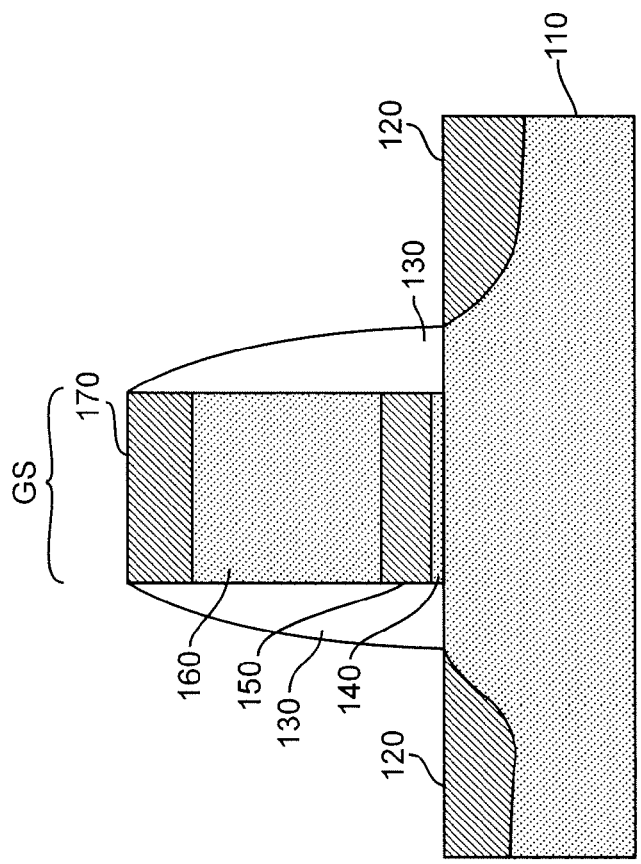
FIG. 1 is a cross-sectional view of an intermediate stage of transistor formation but which includes an optional material substitution in accordance with the invention.
Figure 4:
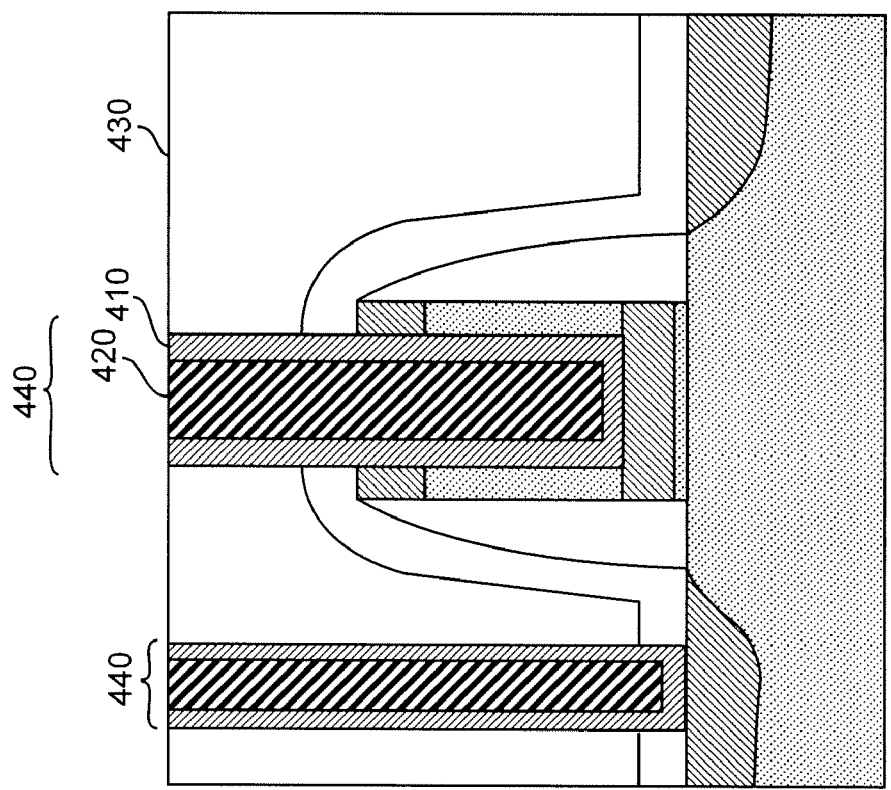
FIG. 4 is a cross-sectional view illustrating completion of low resistance connections to the transistor of FIG. 1.

Referring now to the drawings, and more particularly to FIG. 1, there is shown, in cross-section, a structure of an intermediate stage of fabrication of a transistor in accordance with the invention. It should be understood that FIG. 1 is arranged to facilitate an understanding of the invention and, while the geometry of the structure of FIG. 1 may resemble that of some known transistors, no portion of FIG. 1 is admitted to be prior art in regard to the present invention, particularly since FIG. 1 also illustrates optional use of a material inconsistent with conventional transistor structures as will be discussed below and, also, since the invention, in accordance with its basic principles, is applicable to many transistor designs differing radically from known designs and the geometry of FIG. 1 in particular.

As shown in FIG. 1, the intermediate structure which will result in a transistor in accordance with the invention is formed both in and on a substrate 110 which may be of bulk semiconductor or an active semiconductor layer of a semiconductor on insulator (SOI) chip or wafer. Source and drain (S/D) regions 120 are formed by impurity implantation in accordance with sidewalls 130. It is to be understood that so-called extension implants can be formed adjacent to or extending under the gate stack region GS if desired by implantation and heat treatment for impurity activation and/or diffusion prior to formation of sidewalls 130 which may be compound structures for controlling such implantation in a self-aligned manner, if desired, by processes well-understood by those skilled in the art; the inclusion or omission of which are substantially irrelevant to the successful practice of the invention. The source and drain regions are also preferably silicided by deposition of a layer of metal, preferably nickel, thereon and heat treatment to alloy the metal with the semiconductor substrate material (which is not necessarily silicon—germanium and alloys such as SiGe may also be employed in the practice of the invention).

Gate stack GS is preferably formed beginning with a very thin, high-κ dielectric layer 140, preferably having a thickness of about 15 to 25 Angstroms which is then overlaid with a layer of metal having a non-critical preferred thickness of about 70 to 80 Angstroms to form gate electrode 150. In theory, the metal gate can be very thin but thicknesses below about 25 Angstroms tend to compromise the continuity of the metal film and thus the yield of integrated circuits so formed whereas metal gate thicknesses of more than 200 Angstroms may tend to alter the gate work function and transistor conduction threshold as well as potentially complicate the gate stack patterning as alluded to above. Therefore a metal gate thickness of 70 to 80 Angstroms is preferred as a target thickness and which provides a wide process window of metal gate thickness in which relatively uniform electrical performance will result while avoiding compromise of manufacturing yield by a similarly wide process margin.

The gate body 160 which is generally conductive and formed of semiconductor materials in conventional transistors is overlaid thereon followed by an insulative cap 170, which also assists in patterning the gate stack and may also be useful in providing insulation to prevent shorting to other transistors and is preferably formed of nitride (which can also function as a polish stop if planarization, discussed below, is not well-controlled above it).

In general, to form the gate stack(s) of the transistors of an integrated circuit, it is the practice to provide respective layers of materials in sequence over the surface on which transistors are to be formed and then patterning the cap 170 as a hard mask for patterning the remainder of the gate stack or to pattern the entire gate stack in accordance with a patterned resist which the patterned nitride may assist. An analog of this patterning process is sometimes referred to in regard to conventional transistors as a "PC" process or step.

In this regard, it should be appreciated that, since the invention is directed principally to the provision of low-resistance contacts to the gate and S/D regions of a transistor, gate body 160 need not be conductive. In conventional transistors gate body 160 is usually formed of semiconductor material which, while conductive, also exhibits significant resistance even if doped (either as deposited or by implantation) to enhance conductivity. Dopants may also be used in conventional transistors to adjust work function. However, as alluded to above, when a very thin, high-κ gate dielectric, together with a metal gate electrode, generally considered to be required thereby, is used, such doping not only is ineffective to adjust work function of the gate and the conduction threshold of the transistor, particularly with sufficient accuracy, but also may be a source of dopant implantation or diffusion into the gate dielectric or the transistor channel, as alluded to above; generally compromising manufacturing yield since such effects cannot be readily controlled. Further, since the invention provides low resistance contacts to the transistor, the conductivity of the gate body is made substantially irrelevant to the transistor design. Likewise, an additional advantage derived through the invention is to decouple the contact resistance from the geometry of the gate body and/or the thickness/height of other structures requiring gaps therebetween to be filled to achieve adequate planarization for formation of connections which are sufficiently fine to accommodate the density of integration desired for the design and where a conductor pitch on the order of several tens of nanometers is desired.

Since the conductivity of the gate body 160 is made irrelevant to the transistor design by the low resistance contacts provided by the invention as will be described below, the gate body can be made of any thickness but generally is within the range of zero (e.g. omitted entirely) to one thousand Angstroms. The material thereof is also thus made irrelevant to the electrical characteristics of the transistor and the material of the gate body may be made of any material which is otherwise suitable to the design, including insulating materials such as silicon nitride (SiN) which is preferred as being the same material as is preferred for the cap 170, thereby simplifying the etching process for metal contact formation in accordance with the invention. If, on the other hand, another material is chosen for cap 170, a similar material or a material that can be etched at a comparable rate with the same etchant is generally preferred or, alternatively, for particular applications, dissimilar materials could be used if the performance advantage justifies the relatively minor complication of the etching process to include a further etchant.

Figure 2:
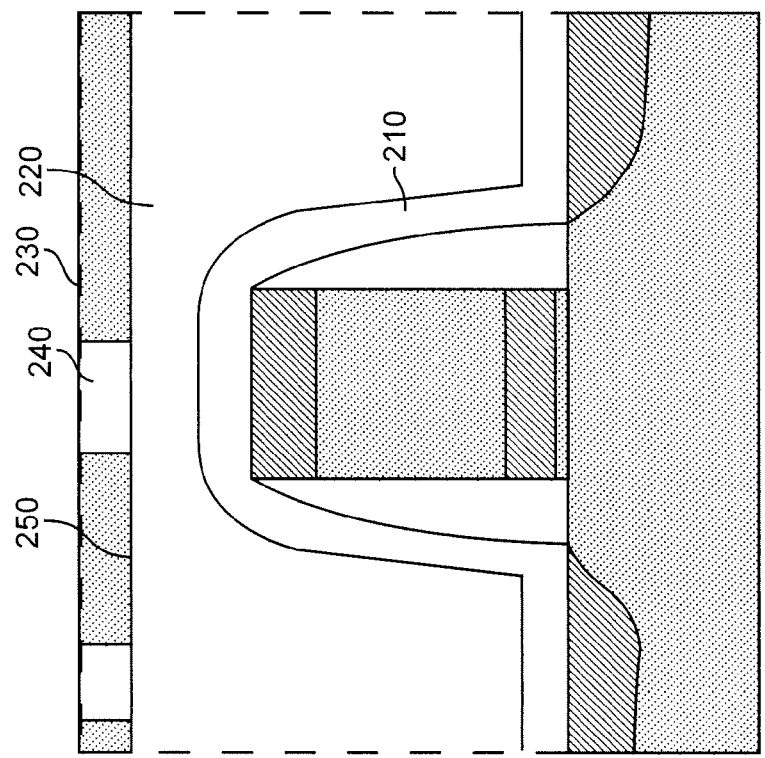
FIGS. 2 and 3 are cross-sectional views illustrating intermediate stages of application of the invention to the transistor of FIG. 1.

Referring now to FIG. 2, in accordance with the invention, the basic structure of FIG. 1 is then preferably covered with an insulating liner 210 which also will provide for selective etching of a fill material 220 relative thereto. For that reason as well as process tolerances, silicon nitride is preferred for liner 210 and silicon oxide is preferred as a fill material 220. The fill material is generally deposited to a substantially greater thickness than shown in FIG. 2 and then polished back using, for example, a chemical-mechanical polishing process well-understood and familiar in the art to achieve a substantially planar surface. Once a sufficiently planar surface 250 is achieved to support very high resolution lithography, a resist layer 230 is applied and patterned as indicated at 240 to define locations for contacts to be made to transistors, in accordance with the invention.

Figure 3:
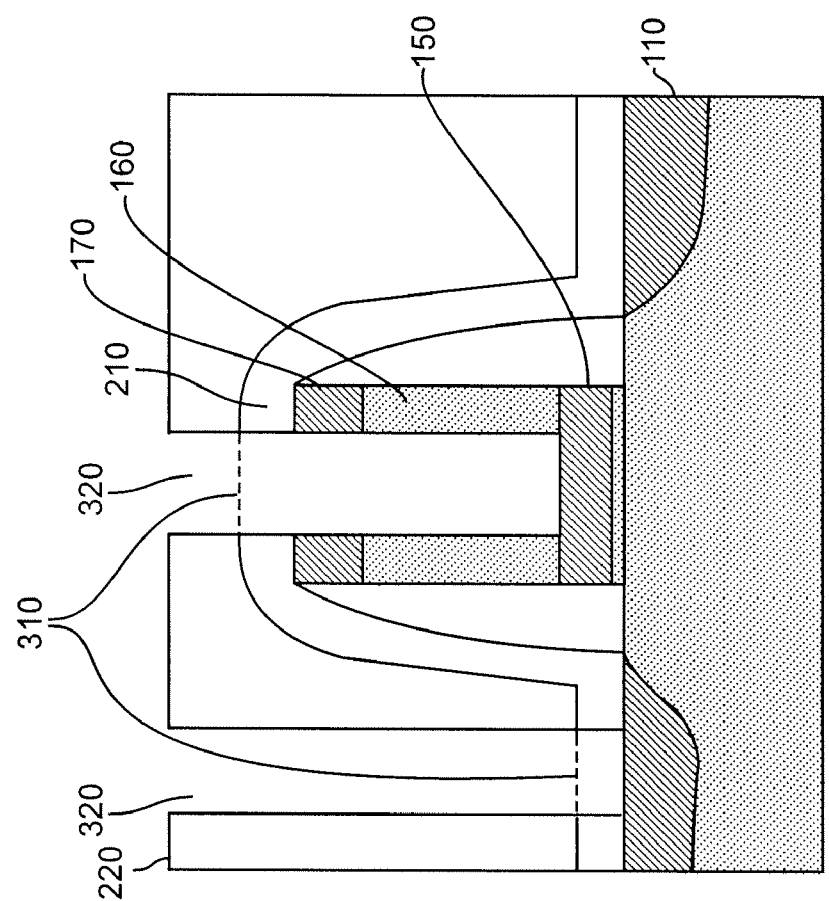

Then, as illustrated in FIG. 3, etching is performed in accordance with the patterning 240 of the resist 230 to the silicided S/D regions (only etching to the source is shown since the drain contact will often be made to another circuit element such as a complementary transistor or a memory capacitor at a location or near the surface of substrate 110 in many integrated circuit designs). The resist can then be removed. It should be noted that the etching process is preferably performed in two stages due to the (typically greatly) differing thicknesses of fill material and gate stack above the gate electrode 150. It should be noted in this regard that, if the preferred alternative (insulating) material (e.g. SiN) is used for the gate body 150, the total thickness of material in layers 160, 170 and 210 in the gate stack will be approximately complementary (depending on the level to which planarization is carried out) to the thickness of fill material 220 above the liner 170. Prevention of over-etching in such a circumstance is greatly facilitated by the liner 210 in that an etch of the fill material selective to the liner 210 (e.g. nitride) can first be performed using the liner 210 as an etch stop and resulting in etching to approximately the levels indicated by dashed lines 310. Suitable etchants for selective etching of oxide preferentially to nitride and vice-versa are familiar to those skilled in the art. A second stage of etching (which may be conducted without interrupting the etching process by simply changing etchants without otherwise interrupting the process) utilizes an etchant such as CHxFx chemistry with a rich polymerization component which is selective to the fill material 220, silicide 120 and metal gate 150 is then performed to complete opening of the gate and S/D regions. Etchants are not particularly critical for this process as long as the etch rate for metal or silicide is significantly less than for the overlying material, as is generally the case for many well-known etchants.

Then, to complete the transistor in accordance with the invention, the openings 320 thus etched as described above are filled with metal, preferably by making a first isotropic deposition of, for example and preferably, a layer of titanium nitride in the form of a liner 410, followed by filling the remainder of the opening 420 with tungsten. While a titanium nitride and tungsten filler is much preferred and can be produced by a common, well-understood and mature process having very good repeatability and high manufacturing yield, single metal depositions which may be of other metals or other sequences of various metals, conductive metal compounds and alloys may also be used as desired, as long as the adhesion provided to surrounding materials is sufficient for high reliability. In general, use of an alternative material such as silicon nitride for gate body 160 and titanium nitride for metal gate 150 will increase the variety of conductive materials which will exhibit suitable adhesion characteristics for successful practice of the invention. The preferred use of nickel for siliciding the S/D regions will also provide excellent adhesion, particularly for the preferred titanium nitride liner and tungsten fill which is similarly preferred. Also, in general, adhesion of the metal contact 440 to the metal gate of silicided S/D is assured due to the metal content of the gate electrode and the S/D structure. Once these transistor contacts have been formed, the surface (on which layers of the metal(s) forming the transistor contacts will also be formed may be etched selectively to the fill material 220 or, preferably, planarized to surface 250 or slightly beyond to form surface 430 which is sufficiently planar to support high resolution lithography for formation of surface (including Damascene) conductors of suitably fine pitch for connection to the low resistance metal transistor contacts in an extremely high density integrated circuit.

In view of the foregoing, it is clearly seen that the invention provides low resistance metal connections to the gate and S/D regions of a transistor having a thin, high-κ gate dielectric and metal gate suitable for inclusion at high integration density in an integrated circuit by a simple and high-yield process with large process margins and which can be applied to any such transistor, regardless of other particulars of design. The fabrication process of such a transistor accommodates surface planarization for forming connections at fine pitch while decoupling the transistor design from gate stack height parameters and providing extended flexibility in choice of materials for the low resistance connections in accordance with the invention although a titanium nitride liner with tungsten filler is very much preferred for most applications, as noted above.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A method of forming a transistor having a high-gate dielectric and a metal, metal alloy or conductive metal compound gate, said method comprising steps of forming a gate stack including a high-κ dielectric layer, a metal, metal alloy or conductive metal compound gate layer on a substrate and at least one of a gate body and a cap, forming silicided regions corresponding to at least one of a source and a drain of said transistor, forming a liner layer over said gate stack and said at least one of a source and a drain of said transistor, forming a layer of fill material having a height equal to or greater than said gate stack, selectively etching said fill material to said liner layer, selectively etching said liner layer and said gate stack to said metal gate and said at least one of a source and drain region, and filling openings formed by said selectively etching steps with metal, metal alloy and/or one or more conductive metal compounds.

2. A method as recited in claim 1, wherein said step of filling said openings includes steps of
- forming a liner in said openings of a first conductive material including a metal, and
- filling a remainder of said openings inside said liner with a metal.

3. A method as recited in claim 2 wherein said step of forming a gate stack includes a step of forming a gate body.

4. A method as recited in claim 3 wherein said gate body is formed of an insulator.

5. A method as recited in claim 4 wherein said insulator is silicon nitride.

6. A method as recited in claim 5 wherein said liner layer is silicon nitride.

7. A method as recited in claim 2 wherein said step of forming a layer of fill material includes an etching or planarizing step.

8. A method as recited in claim 7, wherein said etching or planarizing step forms a thickness of fill material above said gate stack which is approximately complementary to a thickness of fill material adjacent said gate stack.

9. A method as recited in claim 1 wherein said step of forming a gate stack includes a step of forming a gate body.

10. A method as recited in claim 9 wherein said gate body is formed of an insulator.

11. A method as recited in claim 10 wherein said insulator is silicon nitride.

12. A method as recited in claim 1 wherein said liner layer is silicon nitride.

13. A method as recited in claim 1 wherein said step of forming a layer of fill material includes an etching or planarizing step.

14. A method as recited in claim 13, wherein said etching or planarizing step forms a thickness of fill material above said gate stack which is approximately complementary to a thickness of fill material adjacent said gate stack.

15. A method of forming a low resistance contact in an integrated circuit, said method comprising steps of
- forming a liner layer over a portion of said integrated circuit to which said low resistance electrical contact is to be made, said portion including a structure having a height,
- forming a layer of fill material having a height at least equal to said structure having a said height and a thickness of said liner layer,
- selectively etching said fill material to said liner layer,
- selectively etching said liner layer and said structure to said portion of said integrated circuit, and
- filling openings formed by said selectively etching steps with metal.

16. A method as recited in claim 15, wherein said step of filling said openings includes steps of
- forming a liner in said openings of a first conductive material including a metal, and
- filling a remainder of said openings inside said liner with a metal.

17. An integrated circuit including at least one transistor, said transistor comprising
- a gate stack including
  - a high-κ gate dielectric,
  - a metal gate electrode overlying said gate dielectric, and at least one of a gate body and a cap,
- a liner layer extending over said transistor,
- a fill material layer providing a substantially planar surface above said liner, and
- a metal connection extending through said liner layer and said fill material layer into said gate stack to said metal gate electrode.

18. An integrated circuit as recited in claim 17 wherein said gate stack further includes a gate body.

19. An integrated circuit as recited in claim 18 wherein said gate body comprises an insulating material.

20. An integrated circuit as recited in claim 19 wherein said insulating material is silicon nitride.

* * * * *